United States Patent
Cheng et al.

(10) Patent No.: US 12,150,310 B2
(45) Date of Patent: Nov. 19, 2024

(54) FERROELECTRIC RANDOM-ACCESS MEMORY CELL

(71) Applicant: INTERNATIONAL BUSINESS MACHINES CORPORATION, Armonk, NY (US)

(72) Inventors: Kangguo Cheng, Schenectady, NY (US); Julien Frougier, Albany, NY (US); Ruilong Xie, Niskayuna, NY (US); Chanro Park, Clifton Park, NY (US); Min Gyu Sung, Latham, NY (US)

(73) Assignee: International Business Machines Corporation, Armonk, NY (US)

( * ) Notice: Subject to any disclaimer, the term of this patent is extended or adjusted under 35 U.S.C. 154(b) by 216 days.

(21) Appl. No.: 17/819,955

(22) Filed: Aug. 16, 2022

(65) Prior Publication Data
US 2024/0064997 A1 Feb. 22, 2024

(51) Int. Cl.
*H01L 29/78* (2006.01)
*H01L 21/28* (2006.01)
(Continued)

(52) U.S. Cl.
CPC ........ *H10B 51/30* (2023.02); *H01L 29/40111* (2019.08); *H01L 29/42368* (2013.01);
(Continued)

(58) Field of Classification Search
CPC ........ H10B 51/30; H10B 51/10; H10B 51/20; H01L 29/40111; H01L 29/42368;
(Continued)

(56) References Cited

U.S. PATENT DOCUMENTS 6,091,621 A * 7/2000 Wang .................. G11C 11/5657
365/65
6,714,435 B1 * 3/2004 Dimmler ................ H10B 53/00
257/E29.272
(Continued)

FOREIGN PATENT DOCUMENTS

CN 114284354 A 4/2022
DE 102005008392 B4 7/2008
(Continued)

OTHER PUBLICATIONS

Notification of Transmittal of the International Search Report and the Written Opinion of the International Searching Authority, or the Declaration, Date of mailing Nov. 13, 2023, Applicant's or agent's file reference PF230199PCT, International application No. PCT/CN2023/113051, 9 pages.
(Continued)

*Primary Examiner* — Sheikh Maruf
(74) *Attorney, Agent, or Firm* — Yuanmin Cai

(57) ABSTRACT

Embodiments of present invention provide a ferroelectric random-access memory (FeRAM) cell. The FeRAM cell includes a vertical channel between a bottom source/drain region and a top source/drain region; a gate oxide surrounding the vertical channel; and a ferroelectric layer surrounding the gate oxide, wherein the ferroelectric layer has two or more sections of different horizontal thicknesses between the bottom source/drain region and the top source/drain region. A method of manufacturing the FeRAM cell is also provided.

12 Claims, 13 Drawing Sheets

(51) Int. Cl.
*H01L 29/423* (2006.01)
*H01L 29/51* (2006.01)
*H01L 29/66* (2006.01)
*H10B 51/30* (2023.01)

(52) U.S. Cl.
CPC ...... *H01L 29/516* (2013.01); *H01L 29/66666* (2013.01); *H01L 29/6684* (2013.01); *H01L 29/7827* (2013.01); *H01L 29/78391* (2014.09)

(58) Field of Classification Search
CPC ............. H01L 29/516; H01L 29/66666; H01L 29/6684; H01L 29/7827; H01L 29/78391
USPC .......................................................... 257/295
See application file for complete search history.

(56) References Cited

U.S. PATENT DOCUMENTS

| | | | |
|---|---|---|---|
| 6,790,679 B2* | 9/2004 | Dimmler | H01L 29/792 |
| | | | 438/257 |
| 6,888,736 B2* | 5/2005 | Dimmler | H10B 53/00 |
| | | | 257/E29.272 |
| 9,190,135 B2 | 11/2015 | Appenzeller | |
| 9,685,215 B1* | 6/2017 | Kang | G11C 11/223 |
| 9,847,123 B2 | 12/2017 | Karda | |
| 10,109,336 B1 | 10/2018 | Frank | |
| 10,403,631 B1 | 9/2019 | Lu | |
| 10,497,866 B1* | 12/2019 | Fuller | H10B 63/24 |
| 11,037,942 B2 | 6/2021 | Ramaswamy | |
| 2003/0183859 A1* | 10/2003 | Gnadinger | H01L 29/516 |
| | | | 257/295 |
| 2007/0058415 A1 | 3/2007 | Im | |
| 2009/0261395 A1* | 10/2009 | Boescke | H01L 21/02189 |
| | | | 257/295 |
| 2012/0195094 A1* | 8/2012 | Greco | G11C 11/22 |
| | | | 365/145 |
| 2015/0310905 A1* | 10/2015 | Karda | H10B 43/30 |
| | | | 257/295 |
| 2017/0148512 A1* | 5/2017 | Karda | G11C 11/5657 |
| 2018/0277191 A1* | 9/2018 | Yoo | H01L 29/78391 |
| 2018/0366476 A1* | 12/2018 | Liu | H01L 21/02181 |
| 2019/0148286 A1 | 5/2019 | Or-Bach | |
| 2019/0244933 A1 | 8/2019 | Or-Bach | |
| 2019/0259778 A1* | 8/2019 | Yoo | G11C 11/5657 |
| 2020/0091162 A1* | 3/2020 | Morris | H01L 27/0886 |
| 2020/0152645 A1* | 5/2020 | Ramaswamy | H10B 53/30 |
| 2020/0295017 A1 | 9/2020 | Frougier | |
| 2021/0066502 A1 | 3/2021 | Karda | |
| 2021/0398993 A1* | 12/2021 | Haratipour | H10B 53/30 |
| 2021/0408018 A1 | 12/2021 | Haratipour | |
| 2022/0002041 A1 | 1/2022 | Tang | |
| 2022/0020413 A1 | 1/2022 | Tang | |
| 2022/0069131 A1 | 3/2022 | Pesic | |

FOREIGN PATENT DOCUMENTS

| | | |
|---|---|---|
| WO | 2006091108 A1 | 8/2006 |
| WO | 2018071143 A2 | 4/2018 |

OTHER PUBLICATIONS

Bangsaruntip et al., "High Performance and Highly Uniform Gate-All-Around Silicon Nanowire MOSFETs with Wire Size Dependent Scaling", 2009 IEEE, Conference Paper, 5 pages.

Das et al., "FeTRAM. An organic ferroelectric material based novel random access memory cell", Nano Lett. Sep. 14, 2011, Epub Aug. 23, 2011, 1 page.

Jerry et al., "A ferroelectric field effect transistor based synaptic weight cell", Published Aug. 23, 2018, PAPER, Journal of Physics D: Applied Physics, vol. 51, No. 43, 3 pages.

Jerry et al., "Ferroelectric FET Analog Synapse for Acceleration of Deep Neural Network Training", 2017 IEEE, pp. 6.2.1-6.2.4.

Yoon et al., "A FeFET Based Processing-In_Memory Architecture for Solving Distributed Least-Square Optimizations", 2018 IEEE, 2 pages.

* cited by examiner

FERROELECTRIC RANDOM-ACCESS MEMORY CELL

BACKGROUND

The present application relates to manufacturing of semiconductor integrated circuits. More particularly, it relates to a ferroelectric random-access memory cell and method of manufacturing the same.

Analog computing using emerging memories has been considered as a viable option for artificial intelligence (AI) applications. For example, some recently commercialized ferroelectric random-access memory (FeRAM) cells have been used in memory applications where each FeRAM cell holds one bit of two logic states (either logic "1" or logic "0") depending upon the polarization of the ferroelectric layer in the FeRAM cell.

For analog computing application, it is desirable to have FeRAM cells where a single FeRAM cell is capable of holding multiple logic states, which may be realized through changing the polarization of a FeRAM cell gradually to result in a continuum of value or multiple discrete values (instead of two values of "1" or "0") as a function of programming voltage. However, it has been realized that it is extremely challenging, if not impossible, to have a FeRAM cell whose polarization changes gradually.

SUMMARY

Embodiments of present invention provide a ferroelectric random-access memory (FeRAM) cell based on, for example, a ferroelectric vertical-transport field-effect-transistor (Fe-VTFET). The FeRAM cell includes a vertical channel between a bottom source/drain region and a top source/drain region; a gate oxide surrounding the vertical channel; and a ferroelectric layer surrounding the gate oxide, wherein the ferroelectric layer has two or more sections of different horizontal thicknesses between the bottom source/drain region and the top source/drain region. These two or more sections of the ferroelectric layer may be programed to have different combinations of polarizations thereby providing multiple logic states.

In one embodiment, the FeRAM cell further includes a gate metal surrounding the ferroelectric layer, the gate metal has two or more horizontal thicknesses that complement the different horizontal thicknesses of the two or more sections of the ferroelectric layer, resulting in a uniform horizontal thickness measured from the vertical channel.

In another embodiment, the ferroelectric layer includes a bottom section, a middle section, and a top section of three different horizontal thicknesses, the three different horizontal thicknesses being arranged in a staircase shape.

In one embodiment, the top section of the ferroelectric layer is adapted to be programed to have a polarization state that is different from polarization states of the middle section and the bottom section. In another embodiment, the top section and the middle section of the ferroelectric layer are adapted to be programed to have polarization states that are different from a polarization state of the bottom section.

In one embodiment, the ferroelectric layer of the FeRAM includes doped hafnium oxide. In another embodiment, a difference in horizontal thickness between two of the two or more sections of the ferroelectric layer is at least 0.5 nm, which enables the controllability of programming different sections of the ferroelectric layer to have different and/or desired polarization.

Embodiments of present invention further provide a method of forming a FeRAM cell. The method includes forming a vertical channel on top of a bottom epitaxial layer; forming a gate oxide at a side surface of the vertical channel; forming a first layer of ferroelectric material surrounding a first section of the vertical channel; forming a second layer of ferroelectric material surrounding a second section of the vertical channel and the first layer of ferroelectric material; forming a third layer of ferroelectric material surrounding a third section of the vertical channel and the second layer of ferroelectric material; forming a gate metal surrounding the third layer of ferroelectric material; and forming a top epitaxial layer at a top of the vertical channel.

In one embodiment, forming the first layer of ferroelectric material includes forming a first conformal layer of ferroelectric material surrounding the vertical channel; covering a first portion of the first conformal layer of ferroelectric material by a first sacrificial material, the first portion having a vertical height corresponding to the first section of the vertical channel; and removing an exposed portion of the first conformal layer of ferroelectric material that are not covered by the first sacrificial material.

In another embodiment, forming the second layer of ferroelectric material includes forming a second conformal layer of ferroelectric material surrounding the first layer of ferroelectric material and a portion of the vertical channel that is not covered by the first layer of ferroelectric material; covering a second portion of the second conformal layer of ferroelectric material by a second sacrificial material, the second portion having a vertical height corresponding to a sum of the first and second sections of the vertical channel; and removing an exposed portion of the second conformal layer of ferroelectric material that is not covered by the second sacrificial material.

In a further embodiment, forming the third layer of ferroelectric material includes forming a third conformal layer of ferroelectric material surrounding the second layer of ferroelectric material and a portion of the vertical channel that is not covered by the second layer of ferroelectric material; covering a third portion of the third conformal layer of ferroelectric material by a third sacrificial material, the third portion having a vertical height corresponding to a sum of the first, second, and third sections of the vertical channel; and removing an exposed portion of the third conformal layer of ferroelectric material that is not covered by the third sacrificial material.

Embodiments of present invention further includes forming a top spacer surrounding a remaining portion of the vertical channel after removing the exposed portion of the third conformal layer of ferroelectric material to expose underneath thereof the remaining portion of the vertical channel; and further includes, before forming the gate oxide, forming a bottom spacer on top of the bottom epitaxial layer to surround the vertical channel.

In one embodiment, forming the gate oxide includes exposing the vertical channel to an environment with oxygen to oxidize the side surface of the vertical channel.

BRIEF DESCRIPTION OF THE DRAWINGS

The present invention will be understood and appreciated more fully from the following detailed description of embodiments of present invention, taken in conjunction with accompanying drawings of which.

Figure 1:
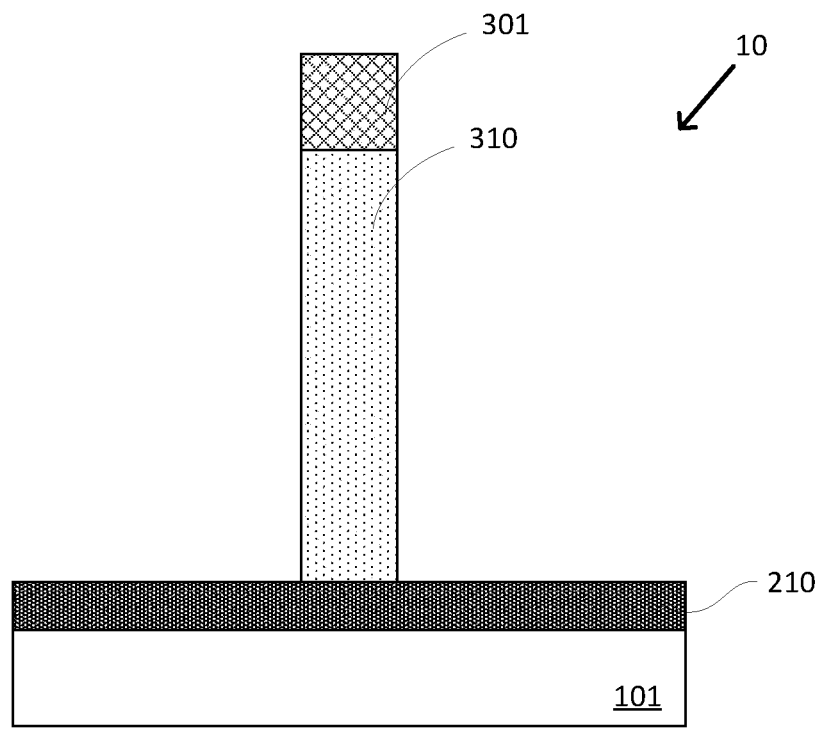
FIGS. 1-24 are demonstrative illustrations of cross-sectional views of a ferroelectric random-access memory (Fe- RAM) cell in a process of manufacturing thereof according to embodiments of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIG. 1 is a demonstrative illustration of cross-sectional view of a FeRAM cell 10 in a step of manufacturing thereof according to one embodiment of present invention. More specifically, embodiments of present invention provide receiving a supporting structure such as, for example, a semiconductor substrate 101 and forming an epitaxial layer on top of the semiconductor substrate 101. The semiconductor substrate 101 may be a bulk substrate such as, for example, a silicon (Si) substrate, a germanium (Ge) substrate, or a silicon-germanium (SiGe) substrate, and may be a silicon-on-insulator (SOI) substrate or a silicon-germanium-on-insulator (SiGeOI) substrate. Other types of substrates may also be used as a supporting structure. The epitaxial layer may be an epitaxially grown Si layer, an epitaxially grown Ge layer, or an epitaxially grown SiGe layer. As being illustrated in FIG. 1, the epitaxial layer may be formed as a bottom epitaxial layer 210 to work or function as a bottom source/drain region of a vertical transistor that works as part of the FeRAM cell 10. The bottom epitaxial layer 210 may be referred to as a bottom source/drain region from time to time hereinafter.

Embodiments of present invention further provide forming a vertical channel 310 on top of the bottom epitaxial layer 210. The vertical channel 310 may be made of silicon material and may be formed through, for example, a lithographic patterning and etching process of a layer of crystalline silicon on top of the bottom epitaxial layer 210 using a hard mask 301. In one embodiment, the vertical channel 310 may have a vertical height between about 15 nm to about 50 nm. Hard mask 301 may be a silicon-nitride (SiN) or other suitable material as a hard mask.

Figure 2:
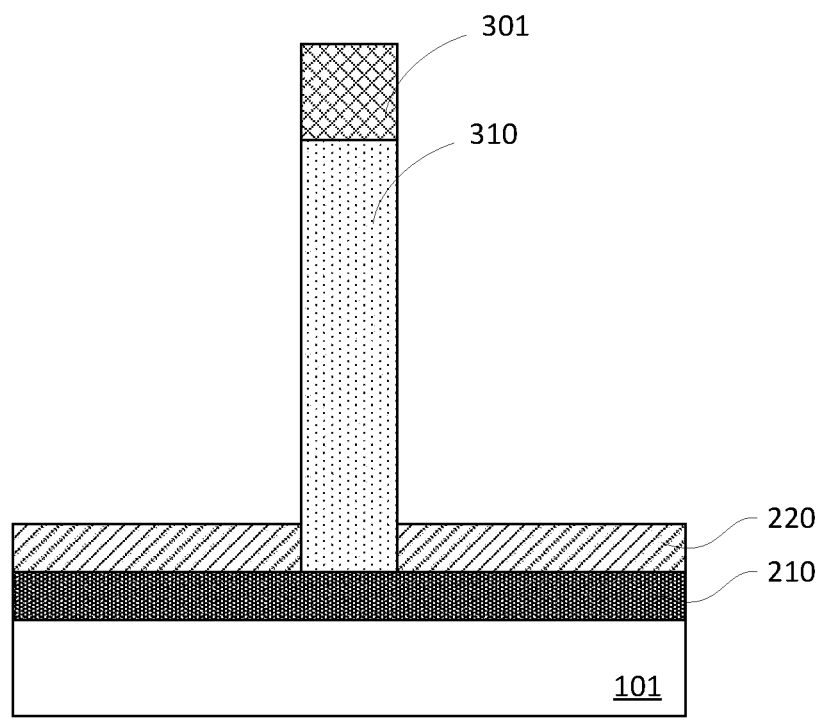

FIG. 2 is a demonstrative illustration of cross-sectional view of the FeRAM cell 10 in a step of manufacturing thereof, following the step illustrated in FIG. 1, according to one embodiment of present invention. More particularly, embodiments of present invention provide forming a bottom spacer 220 on top of the bottom epitaxial layer 210. The bottom spacer 220 surrounds the vertical channel 310 at a bottom portion thereof and may be a layer of dielectric material such as, for example, SiN, silicon-oxide (SiO), or other low-K material such as SiOC, SiON, SiOCN, SiBCN. Other suitable insulating materials may be used as well in forming the bottom spacer 220. The bottom spacer 220 may have a vertical thickness of about 5 nm to 15 nm.

Figure 3:
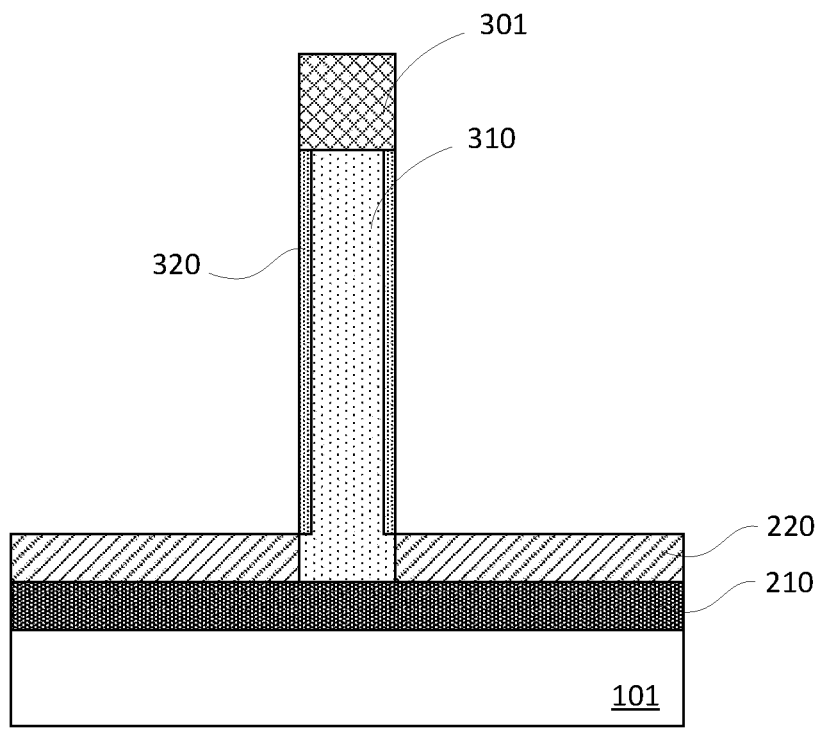

FIG. 3 is a demonstrative illustration of cross-sectional view of the FeRAM cell 10 in a step of manufacturing thereof, following the step illustrated in FIG. 2, according to one embodiment of present invention. More particularly, embodiments of present invention provide forming a gate oxide 320 at a side surface of the vertical channel 310. For example, one embodiment of present invention may include exposing the vertical channel 310 to an environment with oxygen to oxidize the side surface of the vertical channel 310, thereby turning the side surface of the vertical channel 310 into a thin layer of oxide to become the gate oxide 320. The oxidation process may be performed after the formation of the bottom spacer 220 therefore only a portion of the side surface of the vertical channel 310 between the hard mask 301 and the bottom spacer 220 may be oxidized into the gate oxide 320.

Figure 4:
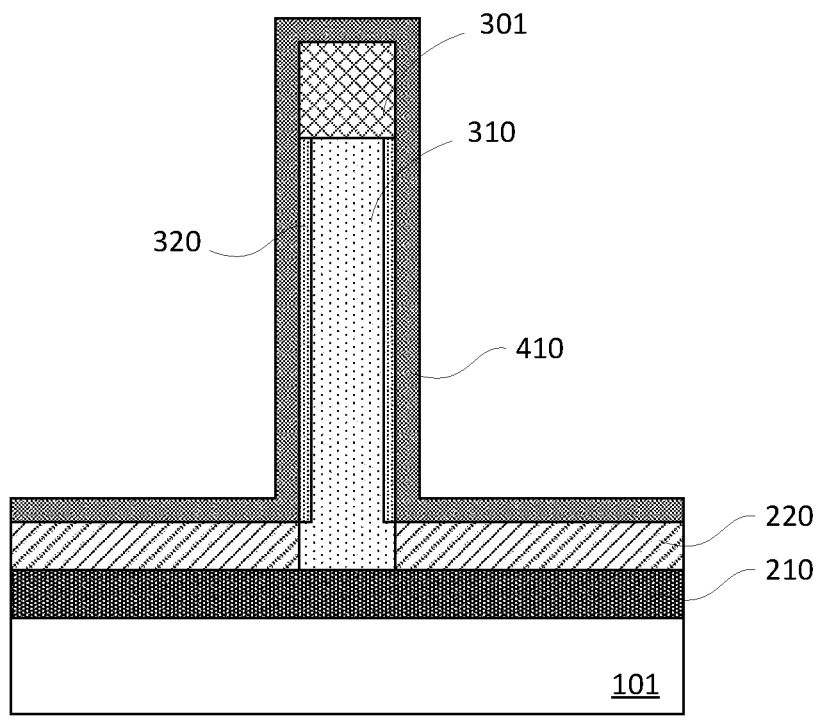

FIG. 4 is a demonstrative illustration of cross-sectional view of the FeRAM cell 10 in a step of manufacturing thereof, following the step illustrated in FIG. 3, according to one embodiment of present invention. More particularly, embodiments of present invention provide forming a first conformal layer 410 of ferroelectric material surrounding the vertical channel 310. For example, in one embodiment, the first conformal layer 410 of ferroelectric material may be formed through, for example, a chemical-vapor-deposition (CVD) process, a physical-vapor-deposition (PVD) process, an atomic-layer-deposition (ALD) process, or other currently existing or future developed means, on top of the bottom spacer 220 and the hard mask 301, on sidewall of the hard mask 301, and on gate oxide 320 that surrounds the vertical channel 310. The first conformal layer 410 may have a thickness ranging from about 1 nm to about 5 nm.

Figure 5:
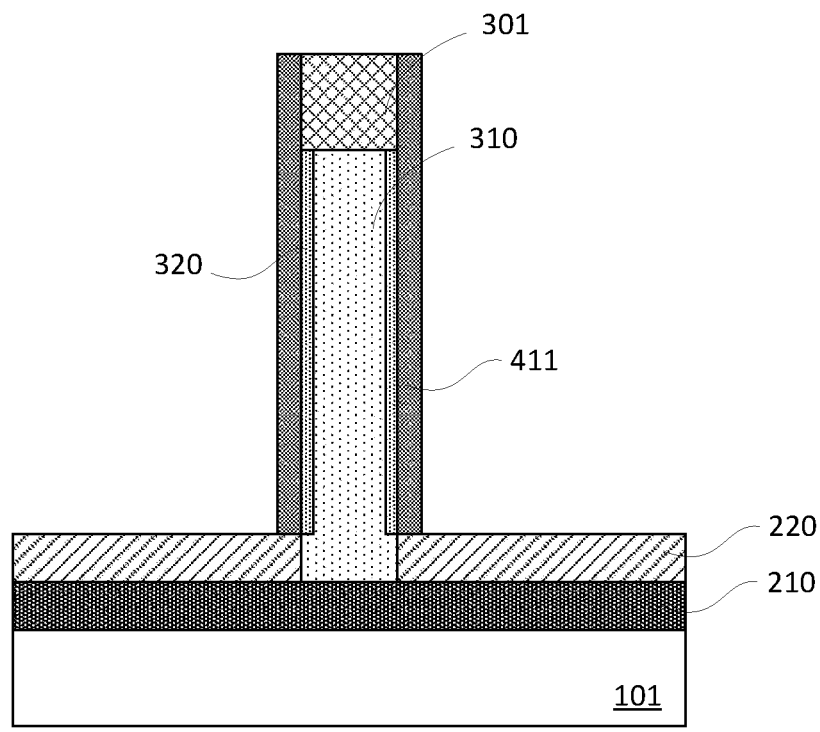

FIG. 5 is a demonstrative illustration of cross-sectional view of the FeRAM cell 10 in a step of manufacturing thereof, following the step illustrated in FIG. 4, according to one embodiment of present invention. More particularly, embodiments of present invention provide performing an anisotropic etching process, such as a reactive-ion-etching (RIE) process, to remove horizontal portions of the first conformal layer 410 of ferroelectric material. For example, the anisotropic etching process may remove portions of the first conformal layer 410 that are on top of the bottom spacer 220 and on top of the hard mask 301 to leave only vertical portions 411 of the first conformal layer 410 against the gate oxide 320.

Figure 6:
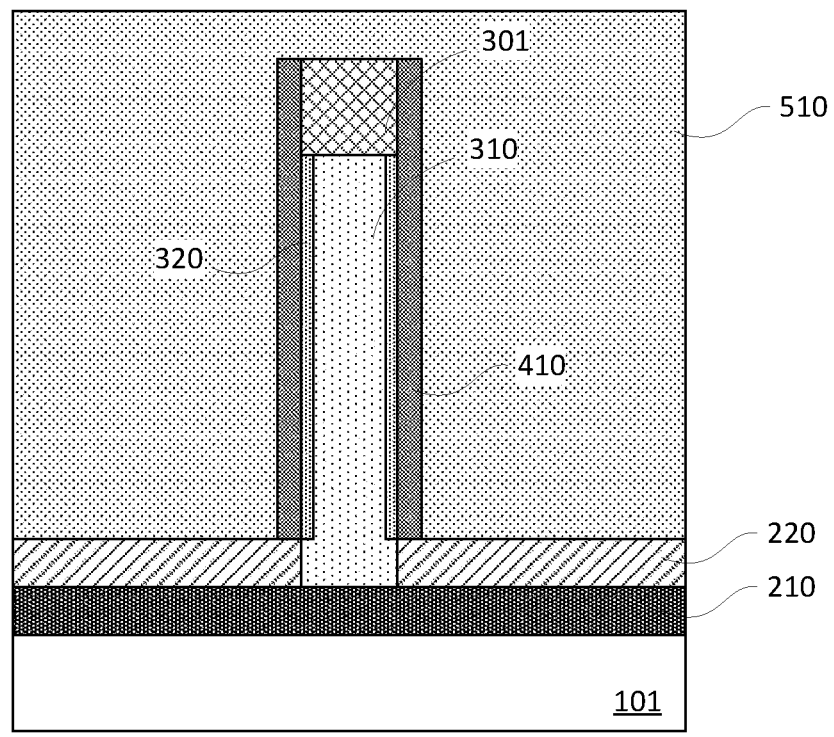

FIG. 6 is a demonstrative illustration of cross-sectional view of the FeRAM cell 10 in a step of manufacturing thereof, following the step illustrated in FIG. 5, according to one embodiment of present invention. More particularly, embodiments of present invention provide forming a layer of sacrificial material such as, for example, a first organic planarization layer (OPL) 510 on top of the FeRAM cell 10 under manufacturing. For example, the first OPL 510 may cover the bottom spacer 220, the vertical portions 411 of the first conformal layer 410, and the top surface of the hard mask 301 to have a height that is higher than the top surface of the hard mask 301.

Figure 7:
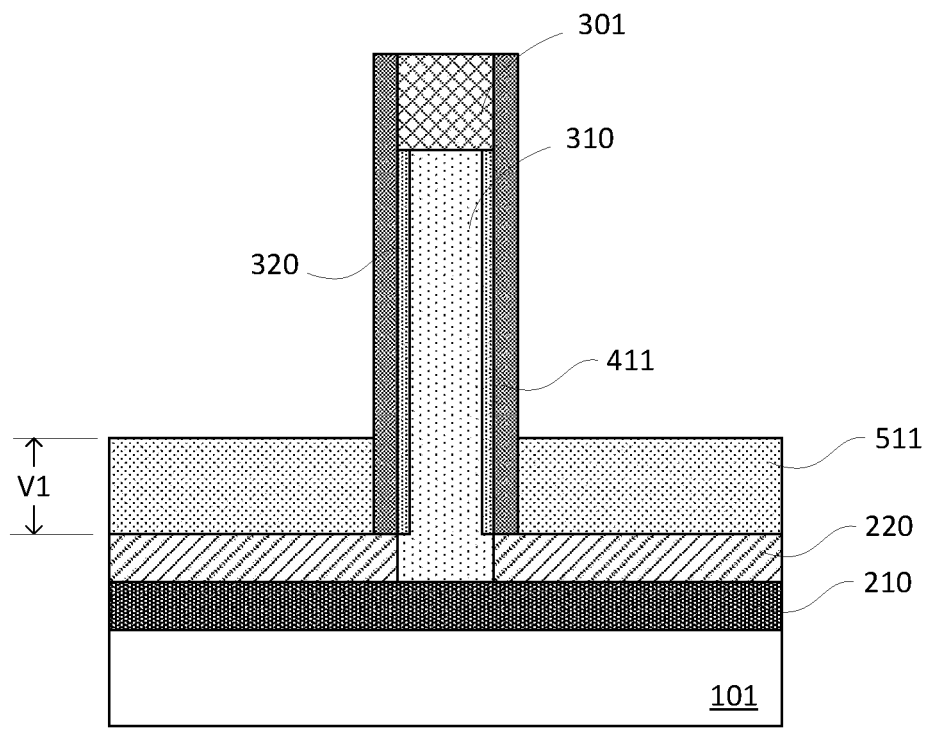

FIG. 7 is a demonstrative illustration of cross-sectional view of the FeRAM cell 10 in a step of manufacturing thereof, following the step illustrated in FIG. 6, according to one embodiment of present invention. More particularly, embodiments of present invention provide recessing the first OPL 510 to expose a portion of the vertical portion 411 of the first conformal layer 410. For example, recessing the first OPL 510 includes creating a first sacrificial material layer such as, for example, a modified first OPL 511 that has a vertical height V1 covering a lower portion of the vertical portion 411 of the first conformal layer 410. The recessing of the first OPL 510 may include etching the OPL material through a RIE process.

Figure 8:
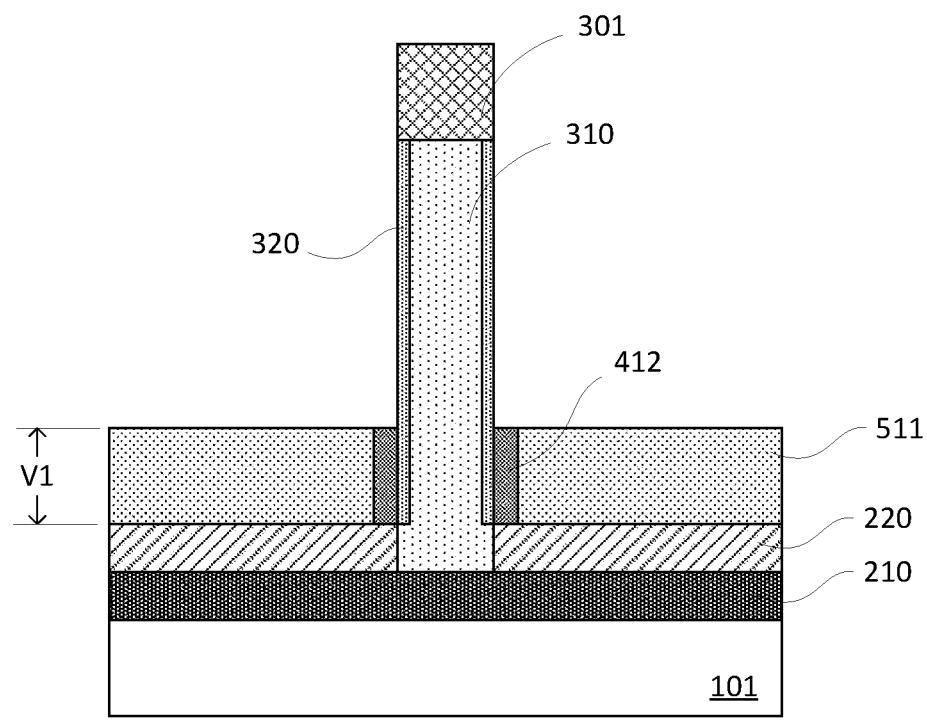

FIG. 8 is a demonstrative illustration of cross-sectional view of the FeRAM cell 10 in a step of manufacturing thereof, following the step illustrated in FIG. 7, according to one embodiment of present invention. More particularly, embodiments of present invention provide removing the exposed portion of the vertical portion 411 of the first conformal layer 410 of ferroelectric material that is not covered by the modified first OPL 511, thereby forming a first layer of ferroelectric material 412 with a vertical height V1 surrounding a first section of the vertical channel 310. The first section of the vertical channel 310 has a corresponding vertical height V1 as is illustrated in FIG. 8.

Figure 9:
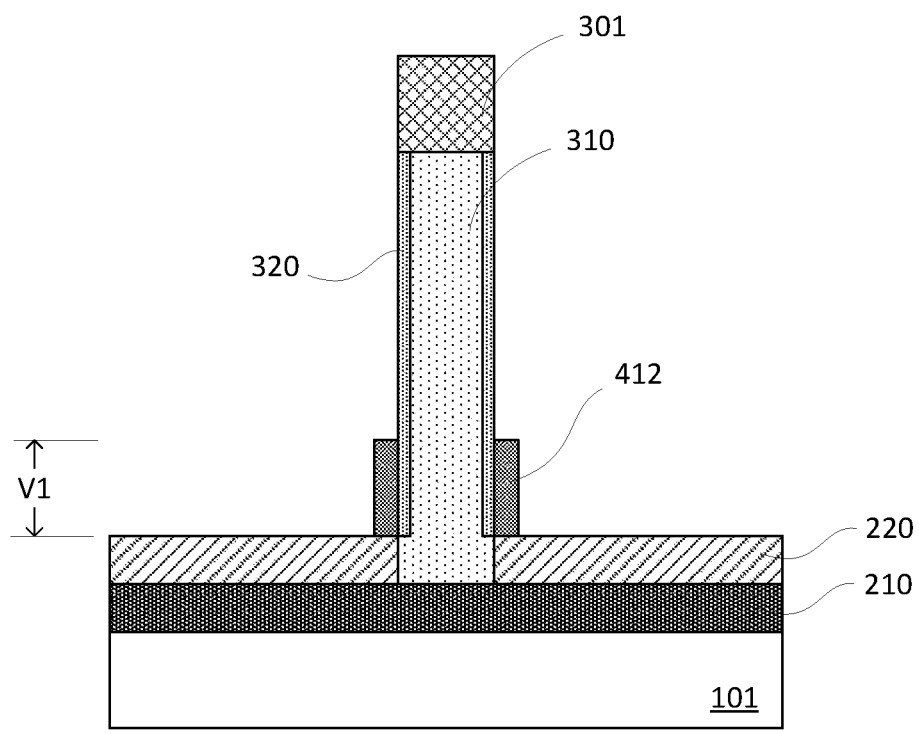

FIG. 9 is a demonstrative illustration of cross-sectional view of the FeRAM cell 10 in a step of manufacturing thereof, following the step illustrated in FIG. 8, according to one embodiment of present invention. More particularly, embodiments of present invention provide removing the first sacrificial material layer of the modified first OPL 511 to expose the first layer of ferroelectric material 412. The first layer of ferroelectric material 412 may have a horizontal thickness, as that of the first conformal layer 410, ranging from about 1 nm to about 5 nm.

Figure 10:
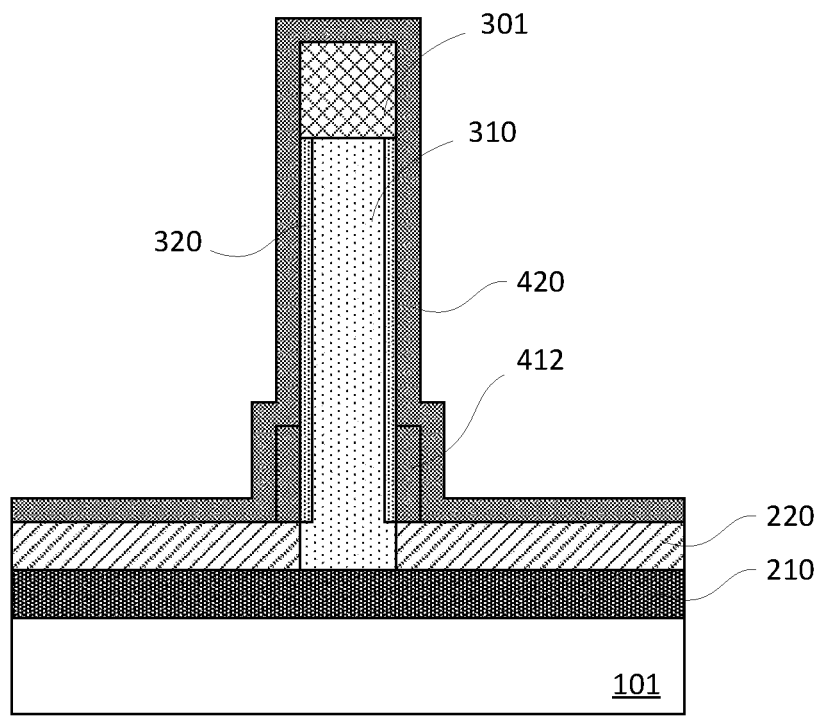

FIG. 10 is a demonstrative illustration of cross-sectional view of the FeRAM cell 10 in a step of manufacturing thereof, following the step illustrated in FIG. 9, according to one embodiment of present invention. More particularly, embodiments of present invention provide forming a second conformal layer 420 of ferroelectric material surrounding the exposed portion of the vertical channel 310 as well as the first layer of ferroelectric material 412. For example, the second conformal layer 420 of ferroelectric material may be formed through, for example, a CVD process, a PVG, an ALD process, or any other suitable means, on the top of the bottom spacer 220, on the top and sidewall of the hard mask 301, on the gate oxide 320 surrounding the exposed portion of the vertical channel 310, and on the first layer of ferroelectric material 412. The second conformal layer 420 may have a thickness ranging from about 1 nm to about 5 nm.

Figure 11:
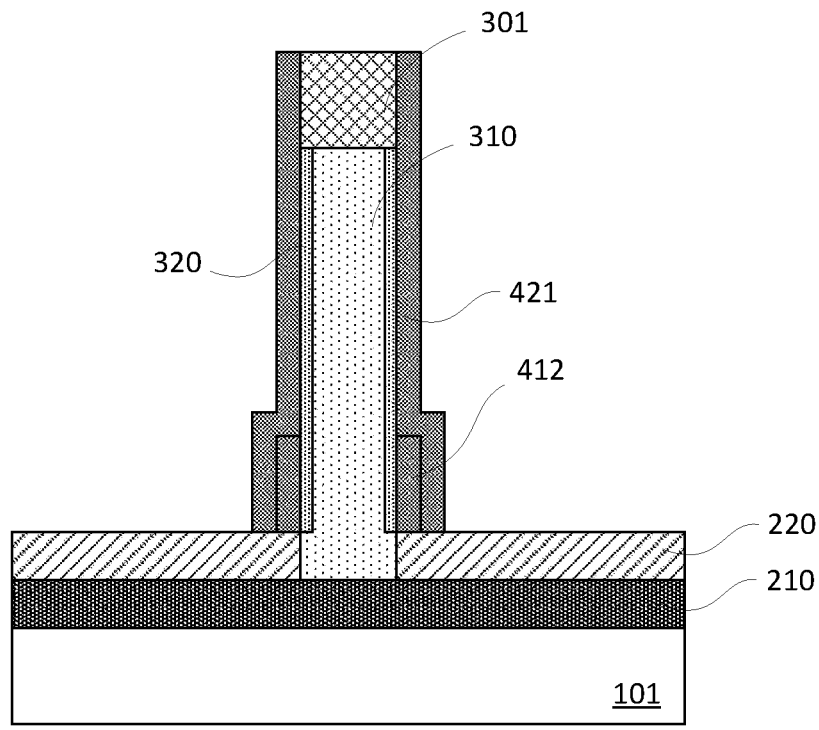

FIG. 11 is a demonstrative illustration of cross-sectional view of the FeRAM cell 10 in a step of manufacturing thereof, following the step illustrated in FIG. 10, according to one embodiment of present invention. More particularly, embodiments of present invention provide performing an anisotropic etching process, such as a RIE process, to remove horizontal portions of the second conformal layer 420 of ferroelectric material, in a step similar to the step illustrated in FIG. 5. For example, the anisotropic etching process may remove horizontal portions of the second conformal layer 420 on the top of the bottom spacer 220 and on the top of the hard mask 301 to leave only vertical portions 421 of the second conformal layer 420 against the gate oxide 320 and against the first layer of ferroelectric material 412.

Figure 12:
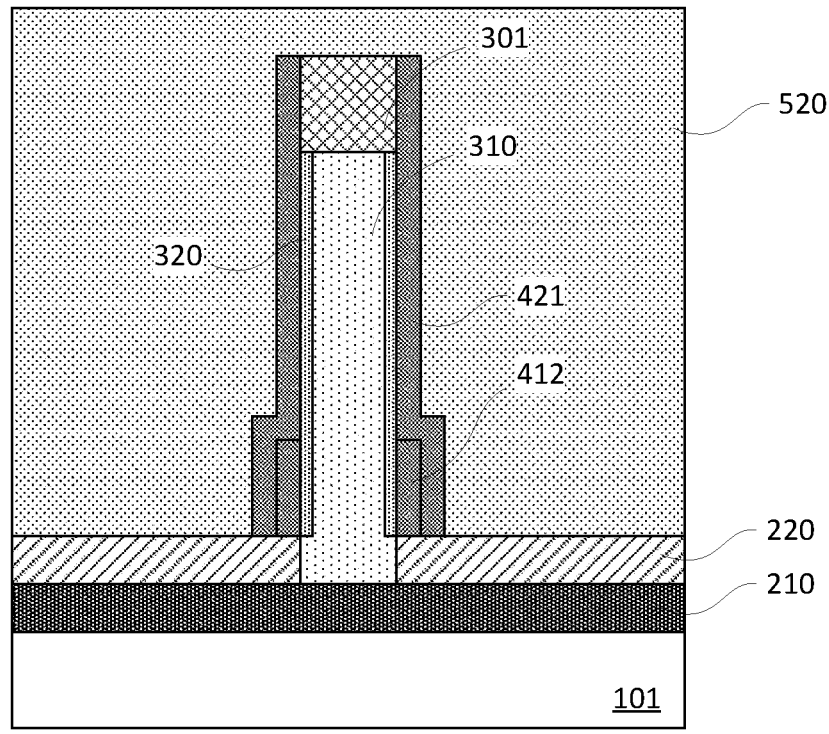

FIG. 12 is a demonstrative illustration of cross-sectional view of the FeRAM cell 10 in a step of manufacturing thereof, following the step illustrated in FIG. 11, according to one embodiment of present invention. More particularly, embodiments of present invention provide forming a layer of sacrificial material such as, for example, a second OPL 520 on top of the FeRAM cell 10 under manufacturing. For example, the second OPL 520 may cover the bottom spacer 220, the vertical portions 421 of the second conformal layer 420, and the top surface of the hard mask 301 to have a height that is higher than the top surface of the hard mask 301.

Figure 13:
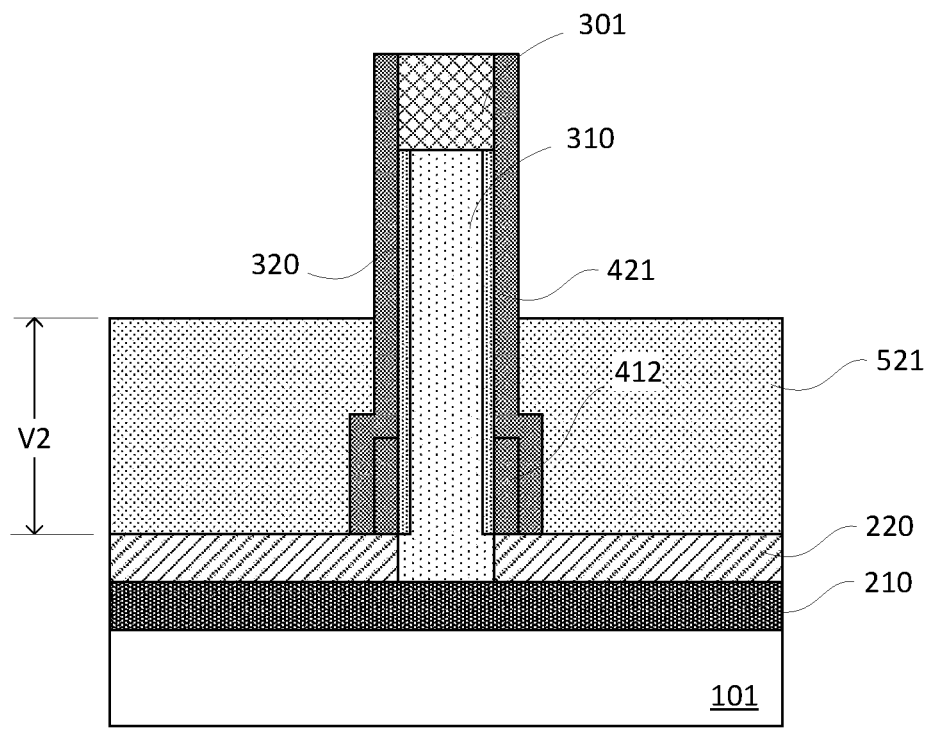

FIG. 13 is a demonstrative illustration of cross-sectional view of the FeRAM cell 10 in a step of manufacturing thereof, following the step illustrated in FIG. 12, according to one embodiment of present invention. More particularly, embodiments of present invention provide recessing the second OPL 520 to expose a portion of the vertical portions 421 of the second conformal layer 420 that is directly against the gate oxide 320 and vertically above the first layer of ferroelectric material 412. For example, recessing the second OPL 520 includes creating a second sacrificial material layer such as, for example, a modified second OPL 521 that has a vertical height V2 covering a lower portion of the vertical portion 421 of the second conformal layer 420. The lower portion of the vertical portion 421 of the second conformal layer 420 covers the first layer of ferroelectric material 412 and a second section of the vertical channel 310 that is directly above the first section of the vertical channel 310. The recessing of the second OPL 520 may include etching the OPL material through a RIE process.

Figure 14:
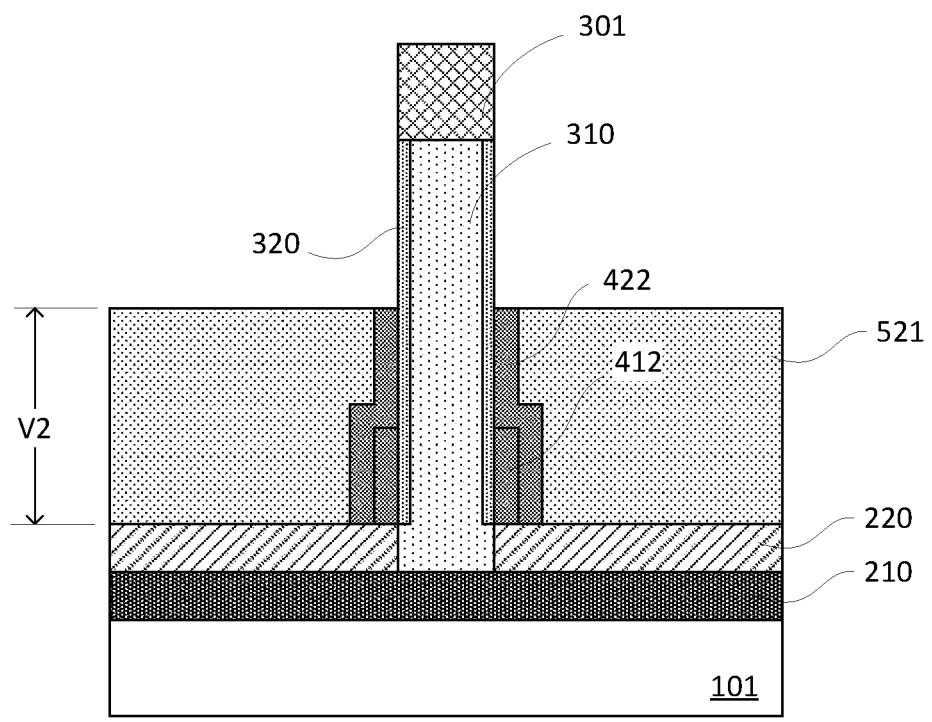

FIG. 14 is a demonstrative illustration of cross-sectional view of the FeRAM cell 10 in a step of manufacturing thereof, following the step illustrated in FIG. 13, according to one embodiment of present invention. More particularly, embodiments of present invention provide removing the exposed portion of the vertical portion 421 of the second conformal layer 420 of ferroelectric material that is not covered by the modified second OPL 521, thereby forming a second layer of ferroelectric material 422 with a vertical height V2 surrounding the second section of the vertical channel 310 and the first layer of ferroelectric material 412. A sum of the heights of the second section of the vertical channel 310 and the first layer of ferroelectric material 412 corresponds to the vertical height V2 of the second layer of ferroelectric material 422 as is illustrated in FIG. 14.

Figure 15:
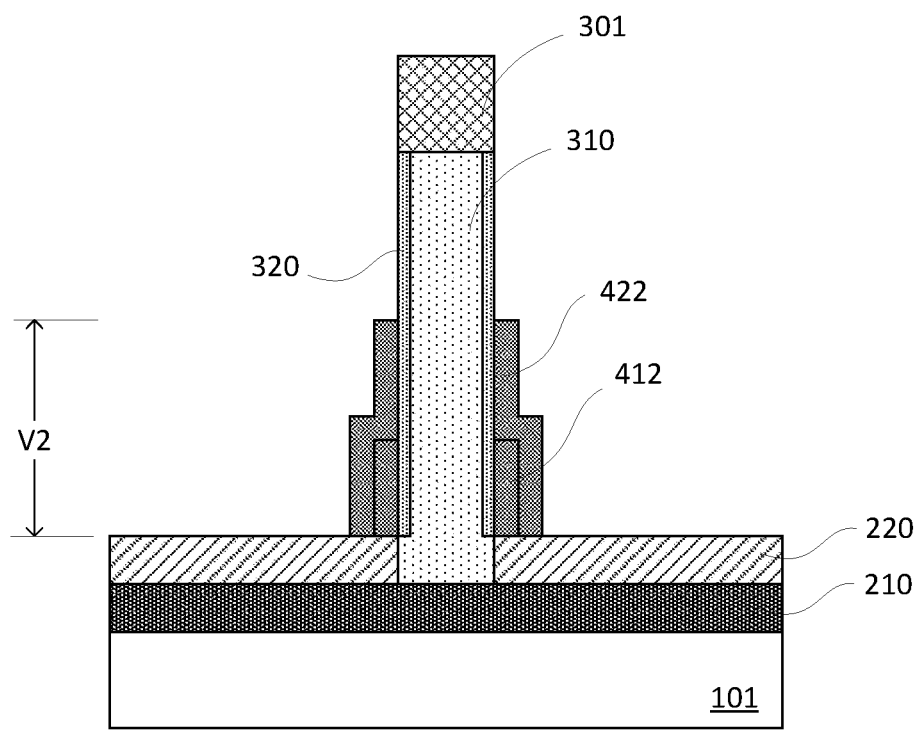

FIG. 15 is a demonstrative illustration of cross-sectional view of the FeRAM cell 10 in a step of manufacturing thereof, following the step illustrated in FIG. 14, according to one embodiment of present invention. More particularly, embodiments of present invention provide removing the second sacrificial material layer of the modified second OPL 521 to expose the second layer of ferroelectric material 422. The second layer of ferroelectric material 422 may have a horizontal thickness, as that of the second conformal layer 420, ranging from about 1 nm to about 5 nm.

Figure 16:
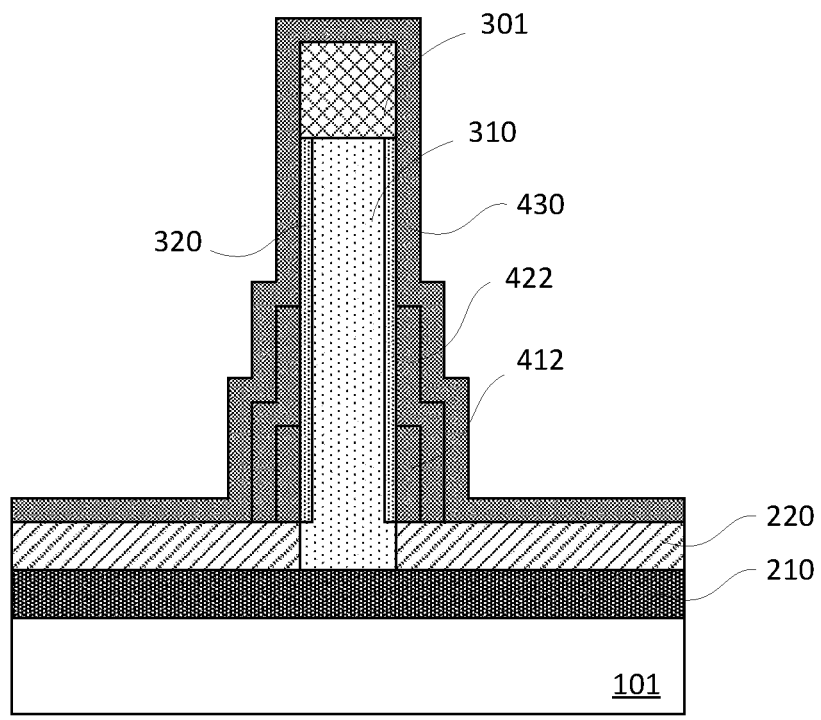

FIG. 16 is a demonstrative illustration of cross-sectional view of the FeRAM cell 10 in a step of manufacturing thereof, following the step illustrated in FIG. 15, according to one embodiment of present invention. More particularly, embodiments of present invention provide forming a third conformal layer 430 of ferroelectric material surrounding the exposed portion of the vertical channel 310 as well as the second layer of ferroelectric material 422. For example, the third conformal layer 430 of ferroelectric material may be formed through, for example, a CVD process, a PVD process, an ALD process, or any other suitable means, on the top of the bottom spacer 220, on the top and sidewall of the hard mask 301, on the gate oxide 320 surrounding the exposed portion of the vertical channel 310, and on the second layer of ferroelectric material 422. The third conformal layer 430 may have a thickness ranging from about 1 nm to about 5 nm.

Figure 17:
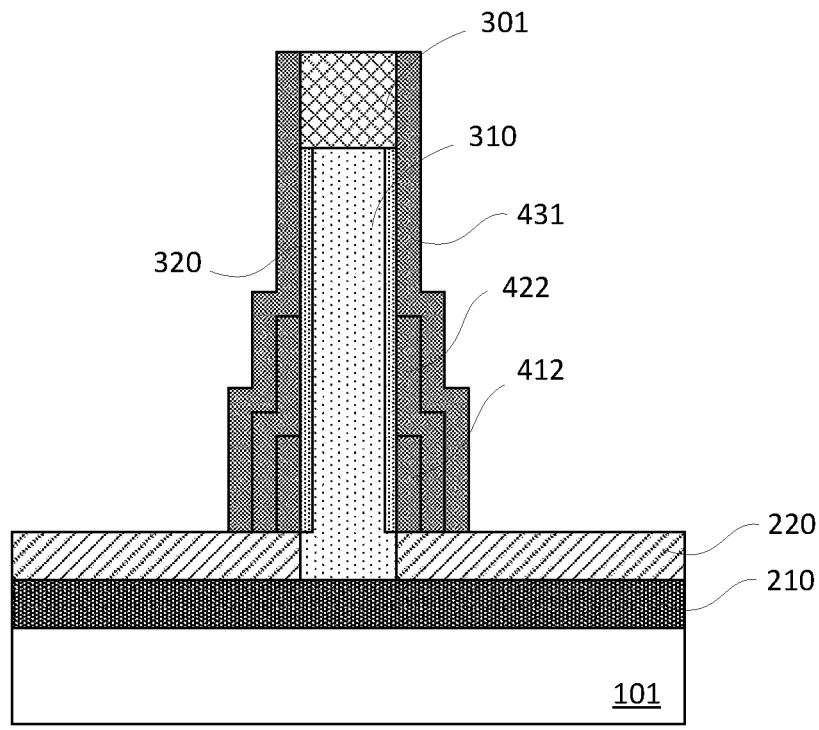

FIG. 17 is a demonstrative illustration of cross-sectional view of the FeRAM cell 10 in a step of manufacturing thereof, following the step illustrated in FIG. 16, according to one embodiment of present invention. More particularly, embodiments of present invention provide performing an anisotropic etching process, such as a RIE process, to remove horizontal portions of the third conformal layer 430 of ferroelectric material, in a step similar to the step illustrated in FIG. 5 as well as in FIG. 11. For example, the anisotropic etching process may remove horizontal portions of the third conformal layer 430 on the top of the bottom spacer 220 and on the top of the hard mask 301 to leave only vertical portions 431 of the third conformal layer 430 against the gate oxide 320 and against the second layer of ferroelectric material 422.

Figure 18:
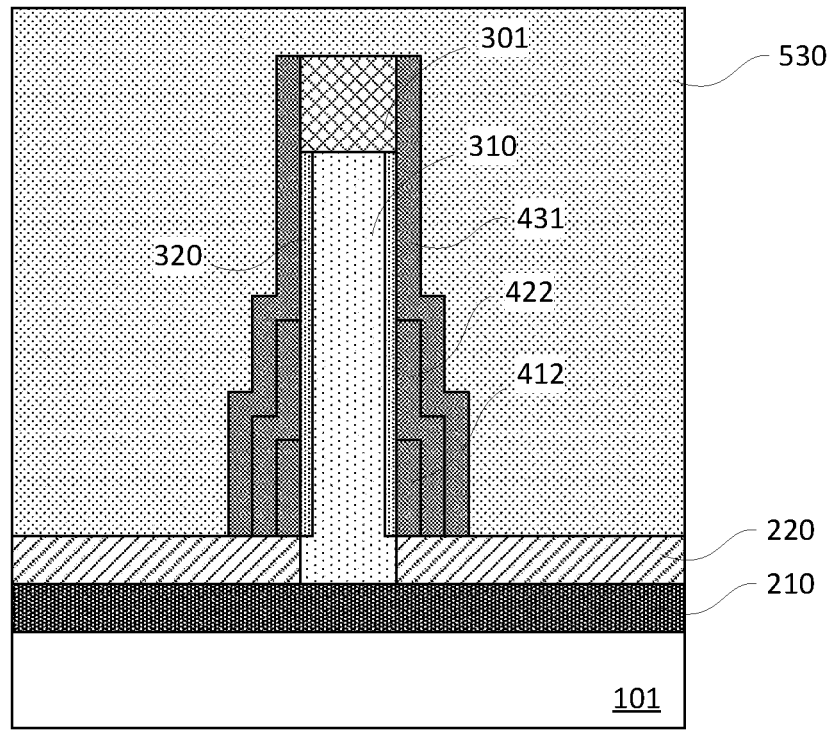

FIG. 18 is a demonstrative illustration of cross-sectional view of the FeRAM cell 10 in a step of manufacturing thereof, following the step illustrated in FIG. 17, according to one embodiment of present invention. More particularly, embodiments of present invention provide forming a layer of sacrificial material such as, for example, a third OPL 530 on top of the FeRAM cell 10 under manufacturing. For example, the third OPL 530 may cover the bottom spacer 220, the vertical portions 431 of the third conformal layer 430, and the top surface of the hard mask 301 to have a height that is higher than the top surface of the hard mask 301.

Figure 19:
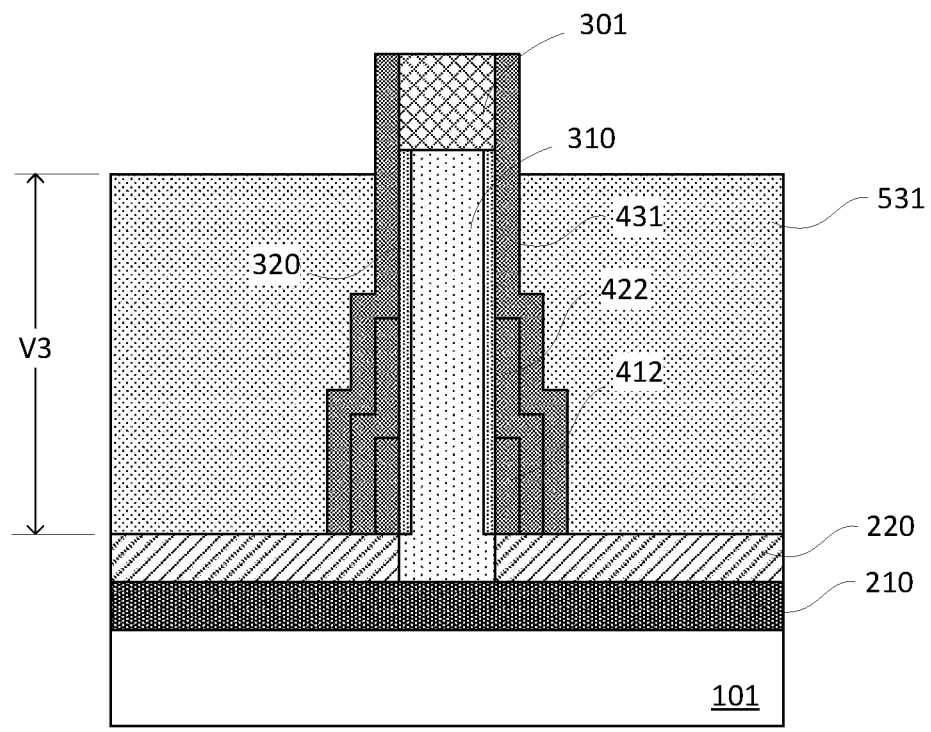

FIG. 19 is a demonstrative illustration of cross-sectional view of the FeRAM cell 10 in a step of manufacturing thereof, following the step illustrated in FIG. 18, according to one embodiment of present invention. More particularly, embodiments of present invention provide recessing the third OPL 530 to expose a portion of the vertical portions 431 of the third conformal layer 430 that is directly against the gate oxide 320 and vertically above the second layer of ferroelectric material 422. For example, recessing the third OPL 530 includes creating a third sacrificial material layer such as, for example, a modified third OPL 531 that has a vertical height V3 covering a lower portion of the vertical portion 431 of the third conformal layer 430. The lower portion of the vertical portion 431 of the third conformal layer 430 covers the second layer of ferroelectric material 422 and a third section of the vertical channel 310 that is directly above the second section of the vertical channel 310. The recessing of the third OPL 530 may include etching the OPL material through a RIE process.

Figure 20:
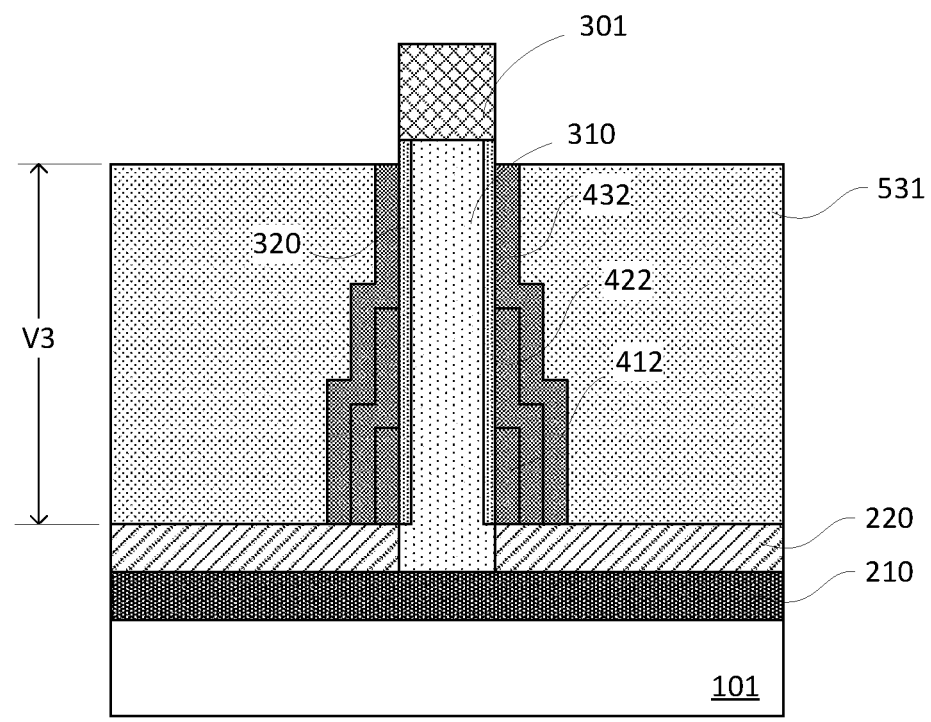

FIG. 20 is a demonstrative illustration of cross-sectional view of the FeRAM cell 10 in a step of manufacturing thereof, following the step illustrated in FIG. 19, according to one embodiment of present invention. More particularly, embodiments of present invention provide removing the exposed portion of the vertical portion 431 of the third conformal layer 430 of ferroelectric material that is not covered by the modified third OPL 531, thereby forming a third layer of ferroelectric material 432 with a vertical height V3 surrounding the third section of the vertical channel 310 and the second layer of ferroelectric material 422. A sum of the heights of the third section of the vertical channel 310 and the second layer of ferroelectric material 422 corresponds to the vertical height V3 of the third layer of ferroelectric material 432 as is illustrated in FIG. 20.

Figure 21:
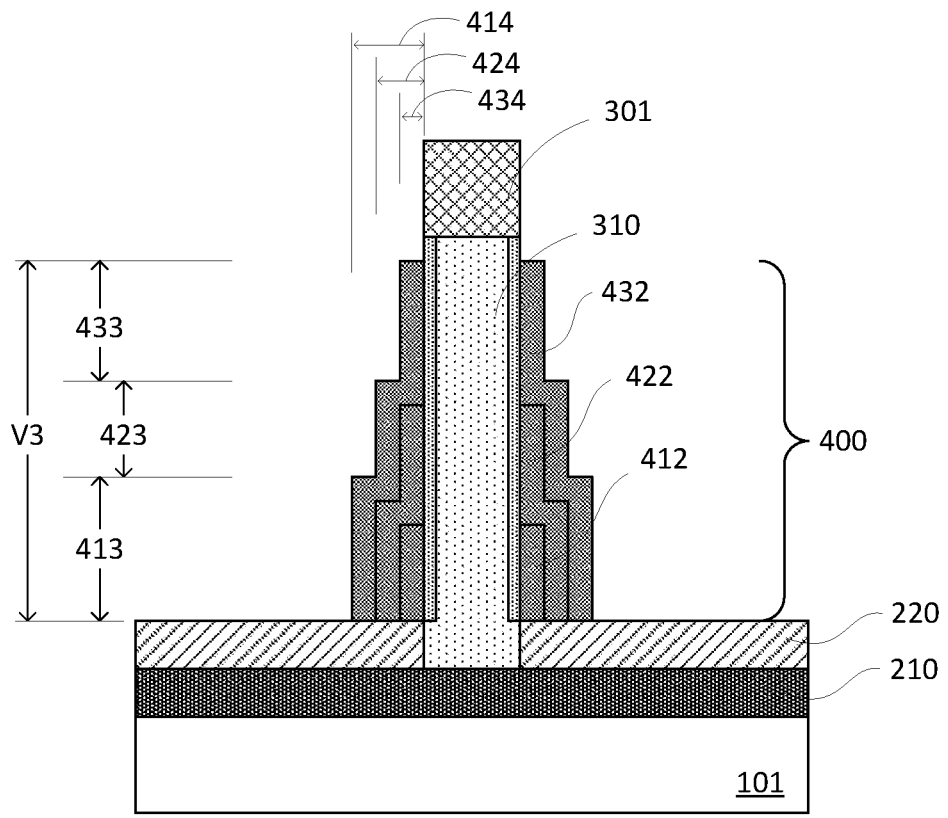

FIG. 21 is a demonstrative illustration of cross-sectional view of the FeRAM cell 10 in a step of manufacturing thereof, following the step illustrated in FIG. 20, according to one embodiment of present invention. More particularly, embodiments of present invention provide removing the third sacrificial material layer of the modified third OPL 531 to expose the third layer of ferroelectric material 432. The third layer of ferroelectric material 432 may have a horizontal thickness, as that of the third conformal layer 430, ranging from about 1 nm to about 5 nm.

According to one embodiment, as being demonstratively illustrated in FIG. 21, the first layer, the second layer, and the third layer of ferroelectric material 412, 422, and 432 may together form a ferroelectric layer 400 surrounding the vertical channel 310 of the FeRAM cell 10. In other words, the ferroelectric layer 400 may have two or more sections of different horizontal thicknesses between the bottom epitaxial layer 210 that works as a bottom source/drain region and a top source/drain region 630 (see FIG. 24). These two or more sections of the ferroelectric layer 400 may be programmed to have different combinations of polarizations thereby providing multiple logic states.

For example, the ferroelectric layer 400 may have a bottom section having a first vertical height 413 and a first horizontal thickness 414; a middle section having a second vertical height 423 and a second horizontal thickness 424; and a top section having a third vertical height 433 and a third horizontal thickness 434. Here, a distinction is made that the bottom, middle, and top sections of the ferroelectric layer 400 differ from the first, second, and third layers of ferroelectric material 412, 422, and 432. Also, the bottom, middle, and top sections of the ferroelectric layer 400 do not correspond to the first, second and third sections of the vertical channel 310, with the first, second and third sections of the vertical channel 310 relating to the process of forming the first, second, and third layers of ferroelectric material 412, 422, and 432.

According to another embodiment, the bottom, middle, and top sections of the ferroelectric layer 400 have three different horizontal thicknesses, and the three different horizontal thicknesses may be arranged in a staircase shape. For example, the bottom, middle, and top sections 413, 423, and 433 of the ferroelectric layer 400 may have, respectively, a first horizontal thickness 414, a second horizontal thickness 424, and a third horizontal thickness 434, and the second horizontal thickness 424 may be larger than the third horizontal thickness 434 but smaller than the first horizontal thickness 414.

In one embodiment, a difference between the first and second horizontal thicknesses 414 and 424 (between the first and second sections 413 and 423) or a difference between the second and third horizontal thicknesses 424 and 434 (between the second and third sections 423 and 433) of the ferroelectric layer 400 may be at least 0.5 nm, may be larger than 1 nm, and may be in some embodiment as large as 5 nm. In other words, a difference in horizontal thickness between two of the first, second, and third sections is at least 0.5 nm. This difference of at least 0.5 nm enables the controllability of programming different sections of the ferroelectric layer to have different and/or desired polarizations. In another embodiment, the ferroelectric layer 400 may be made of or include hafnium zirconium oxide (HZO) or suitable perovskite oxides with the generic formula ABO3.

According to another embodiment, the first vertical height 413 of the bottom section, the second vertical height 423 of the middle section, and the third vertical height 433 of the top section may be made the same. In another embodiment, in order to balance and/or adjust differences in operating current at different states, as being described below in more details, the first, second, and third vertical heights of the bottom, middle, and top sections 413, 423, and 433 may be made different. More specifically, in consideration of bringing the respective volumes of ferroelectric material in the bottom, middle, and top sections closer to each other, the second vertical height 423 of the middle section may be made larger than the first vertical height 413 of the bottom section but smaller than the third vertical height 433 of the top section of the ferroelectric layer 400.

Figure 22:
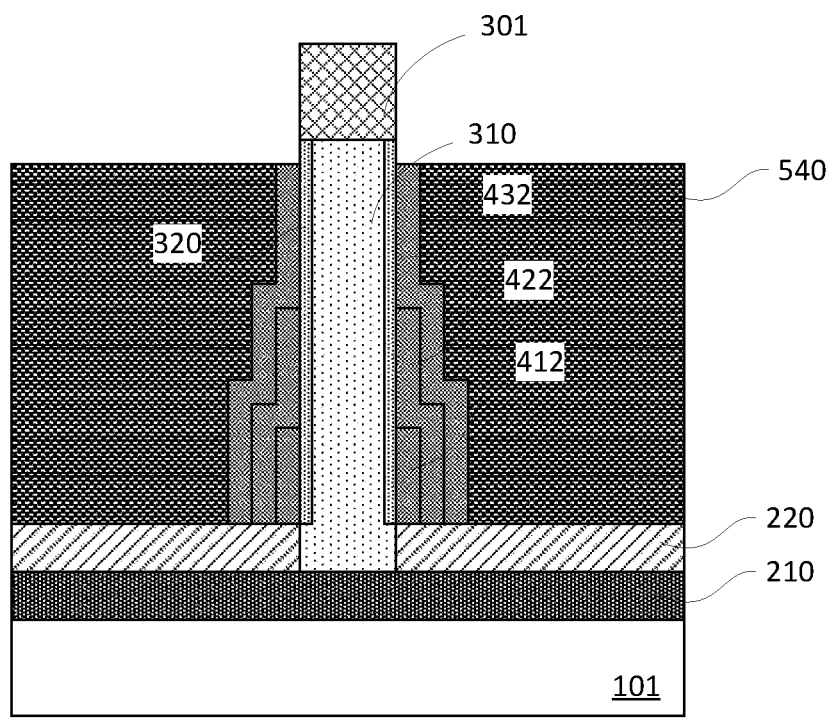

FIG. 22 is a demonstrative illustration of cross-sectional view of the FeRAM cell 10 in a step of manufacturing thereof, following the step illustrated in FIG. 21, according to one embodiment of present invention. More particularly, embodiments of present invention provide forming a gate metal 540 surrounding the third layer of ferroelectric material 432 and on the top of the bottom spacer 220. As is demonstratively illustrated in FIG. 22, in one embodiment, a sum of the horizontal thicknesses of the gate metal 540 and the ferroelectric layer 400 remains substantially the same at different sections of the ferroelectric layer 400. In other words, the gate metal 540 may have multiple horizontal thicknesses that complement the horizontal thicknesses of the ferroelectric layer 400. For example, the bottom section of the ferroelectric layer 400 may have a largest horizontal thickness while the gate metal 540 surrounding the bottom section of the ferroelectric layer 400 may have a smallest horizontal thickness. On the other hand, the top section of the ferroelectric layer 400 may have a smallest horizontal thickness while the gate metal 540 surrounding the top section of the ferroelectric layer 400 may have a largest horizontal thickness. As a resulting, a uniform horizontal thickness measured from the vertical channel 310 to the outer sidewall of the gate metal 540 may be achieved.

In one embodiment, the gate metal 540 may include, for example, tungsten (W), copper (Cu), ruthenium (Ru), and other suitable materials, and may be formed through, for example, a CVD process, a PVD process, or an ALD process, and subsequently recessed to have a height corresponding to the vertical height V3 of the third layer of ferroelectric material 432.

Figure 23:
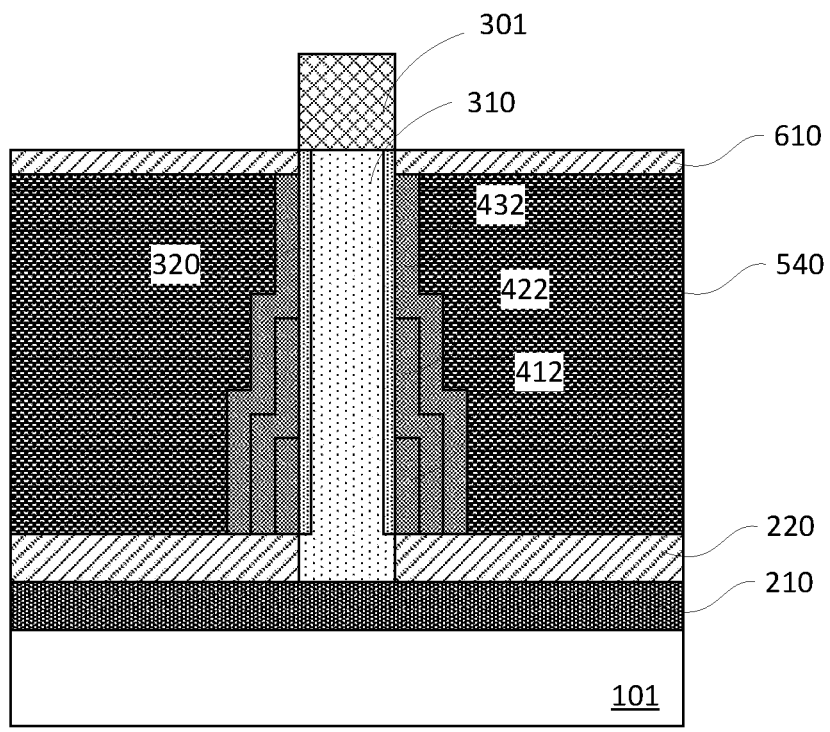

FIG. 23 is a demonstrative illustration of cross-sectional view of the FeRAM cell 10 in a step of manufacturing thereof, following the step illustrated in FIG. 22, according to one embodiment of present invention. More particularly, embodiments of present invention provide forming a top spacer 610 on top of the gate metal 540. The top spacer 610 may be deposited on top of the gate metal 540 to surround the remaining exposed portion of the vertical channel 310, and may include dielectric materials such as, for example, SiN, SiO, SiOC, SiON, SiOCN, SiBCN and/or other suitable insulating materials.

Figure 24:
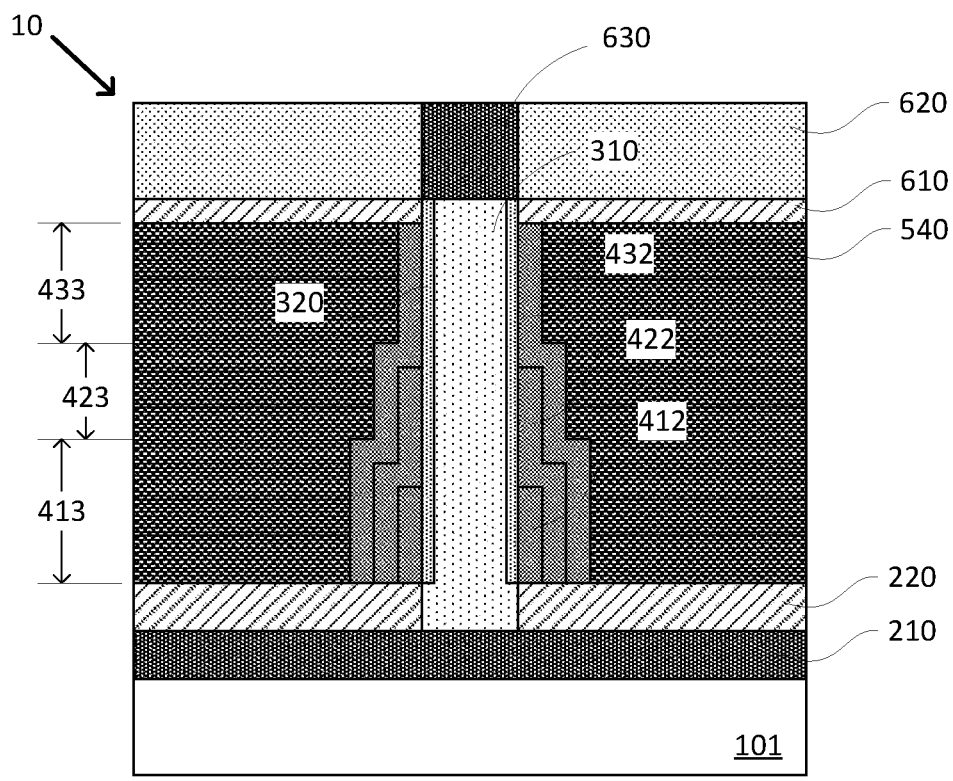

FIG. 24 is a demonstrative illustration of cross-sectional view of the FeRAM cell 10 in a step of manufacturing thereof, following the step illustrated in FIG. 23, according to one embodiment of present invention. More particularly, embodiments of present invention provide depositing an inter-level dielectric (ILD) layer 620 on top of the top spacer 610. The ILD layer 620 may be deposited to a level above the hard mask 301. A CMP process may subsequently be applied to planarize a top surface of the ILD layer 620 to expose the hard mask 301. After the CMP process, the hard mask 301 may be selectively removed to expose an end surface of the underneath vertical channel 310. A top epitaxial source/drain region 630 may then be formed through an epitaxial growth process. The top source/drain region may be, for example, an epitaxial silicon-germanium (SiGe) region.

According to one embodiment, during operation, the FeRAM cell 10 may be programmed to have multiple logic states. For example, in one embodiment, the top section of the ferroelectric layer 400 may be programed to have a polarization state that is differently from polarization states of the middle section and the bottom section. In another embodiment, the top section and the middle section of the ferroelectric layer 400 may be programed to have polarization states that are differently from a polarization state of the bottom section.

The polarization state of the bottom section, middle section, and top section of the ferroelectric layer 400 may be controlled through the programing voltage applied to the gate metal 540. For example, in a first instance when a high voltage is applied to the gate metal 540, the bottom, middle, and top sections of the ferroelectric layer 400 may be programed to have one polarization state, resulting the FeRAM to produce a highest sensing current. In a second instance when a median voltage is applied to the gate metal 540, only the middle and top sections of the ferroelectric layer 400 may be programed to have one polarization state while the median voltage may not be large enough to program the bottom section, resulting the bottom section to have a polarization state different from the middle and top sections and thus producing a sensing current smaller than in the first instance. In a third instance when a low voltage is applied to the gate metal 540, only the top section of the ferroelectric layer 400 may be programed to have one polarization state while the low voltage may not be large enough to program the middle and bottom sections, resulting the middle and bottom sections to have a polarization state different from the top section and thus producing a sensing current that is smaller than in the first and the second instances. In a fourth instance when no voltage is applied to the gate metal 540, polarization state of the bottom, middle, and top sections remain in a state different from that in the first instance and the FeRAM produces no sensing current. It is apparent from the above that embodiments of present invention provide a FeRAM that may have multiple, such as 4, logic states. However, embodiments of present invention are not limited in this aspect and, for example, more or less different sections of a ferroelectric layer may be used to create a ferroelectric random-access memory that has more or less different logic states.

Figure 25:
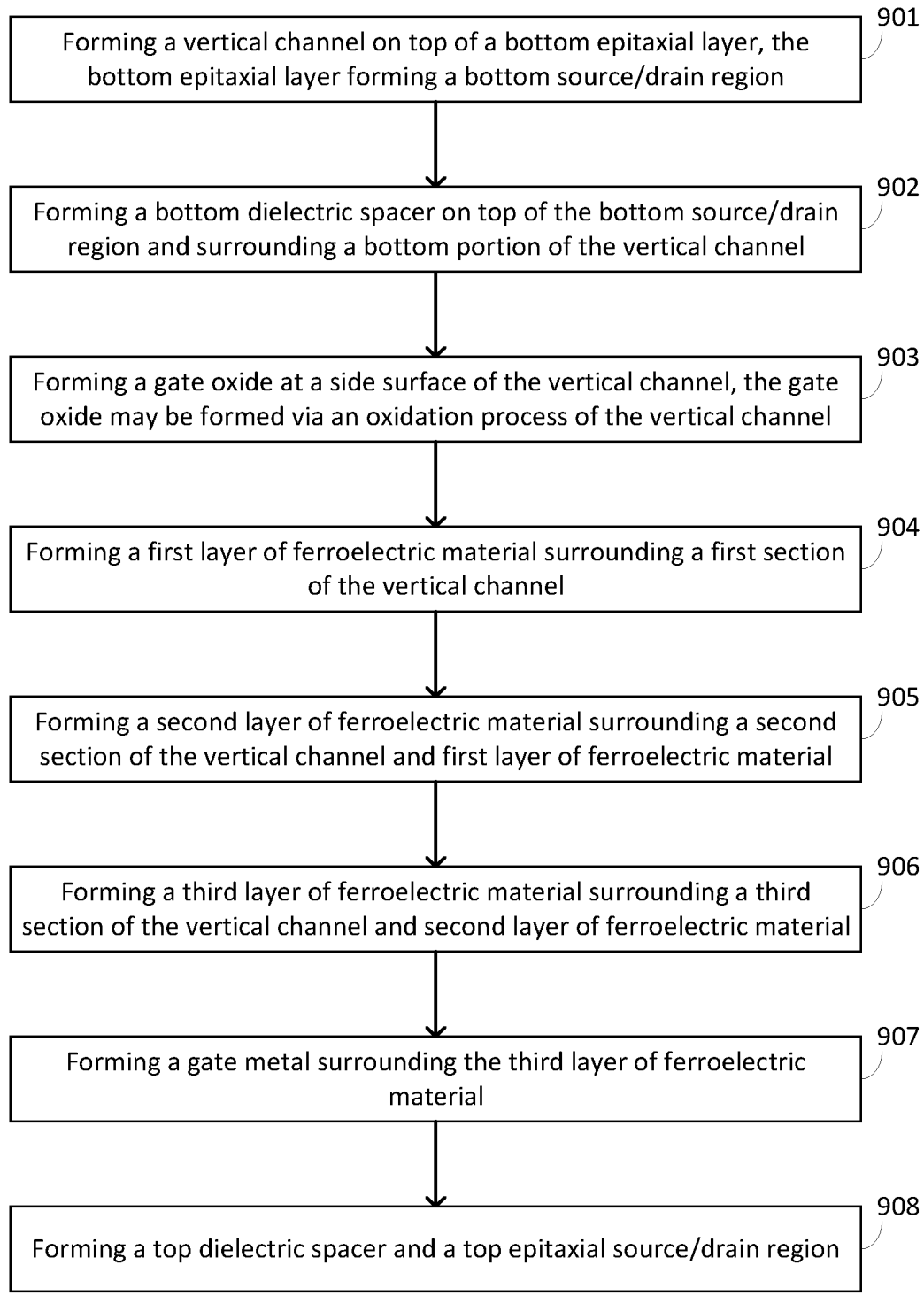
FIG. 25 is a demonstrative illustration of a flow-chart of a method of manufacturing a FeRAM cell according to embodiments of present invention.

FIG. 25 is a demonstrative illustration of a flow-chart of a method of manufacturing a ferroelectric random-access memory (FeRAM) cell according to embodiments of present invention. The method includes (901) forming a vertical channel on top of a bottom epitaxial layer, the bottom epitaxial layer forming a bottom source/drain region; (902) forming a bottom spacer of dielectric material on top of the bottom source/drain region with the bottom spacer surrounding a bottom portion of the vertical channel; (903) forming a gate oxide at a side surface of the vertical channel, where the gate oxide may be formed for example through an oxidation process of the side surface of the vertical channel; (904) forming a first layer of ferroelectric material surrounding a first section of the vertical channel; (905) forming a second layer of ferroelectric material surrounding a second section of the vertical channel and the first layer of ferroelectric material; (906) forming a third layer of ferroelectric material surrounding a third section of the vertical channel and the second layer of ferroelectric material; (907) forming a gate metal surrounding the third layer of ferroelectric material; and (908) forming a top spacer of dielectric material and a top epitaxial source/drain region.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A ferroelectric random-access memory (FeRAM) cell comprising:
 a vertical channel between a bottom source/drain region and a top source/drain region;
 a gate oxide surrounding the vertical channel; and
 a ferroelectric layer surrounding the gate oxide,
 wherein the ferroelectric layer has two or more sections of different horizontal thicknesses between the bottom source/drain region and the top source/drain region, and wherein the ferroelectric layer comprises a bottom section, a middle section, and a top section of three different horizontal thicknesses, the three different horizontal thicknesses being arranged in a staircase shape.

2. The FeRAM cell of claim 1, further comprising a gate metal surrounding the ferroelectric layer, the gate metal has two or more horizontal thicknesses that complement the different horizontal thicknesses of the two or more sections of the ferroelectric layer.

3. The FeRAM cell of claim 1, wherein the top section of the ferroelectric layer is adapted to be programed to have a polarization state that is different from polarization states of the middle section and the bottom section.

4. The FeRAM cell of claim 1, wherein the top section and the middle section of the ferroelectric layer are adapted to be programed to have polarization states that are different from a polarization state of the bottom section.

5. The FeRAM cell of claim 1, wherein the ferroelectric layer comprises doped hafnium oxide.

6. The FeRAM cell of claim 1, wherein a difference in horizontal thickness between two of the two or more sections of the ferroelectric layer is at least 0.5 nm.

7. A ferroelectric random-access memory (FeRAM) cell comprising:
 a vertical channel between a bottom source/drain region and a top source/drain region;
 a gate oxide surrounding the vertical channel;
 a ferroelectric layer surrounding the gate oxide; and
 a gate metal surrounding the ferroelectric layer, wherein the ferroelectric layer has a bottom section, a middle section, and a top section that are arranged in a staircase shape.

8. The FeRAM cell of claim 7, wherein the bottom section, the middle section, and the top section of the ferroelectric layer have, respectively, a first horizontal thickness, a second horizontal thickness, and a third horizontal thickness, wherein the second horizontal thickness is larger than the third horizontal thickness but smaller than the first horizontal thickness.

9. The FeRAM cell of claim 7, wherein the bottom section, the middle section, and the top section of the ferroelectric layer have, respectively, a first vertical height, a second vertical height, and a third vertical height, wherein the second vertical height is smaller than the third vertical height but larger than the first vertical height.

10. The FeRAM cell of claim 7, wherein the top section of the ferroelectric layer is adapted to be programmed to have a first polarization state and the middle section and the bottom section of the ferroelectric layer are adapted to be programmed to have a second polarization state, wherein the second polarization state is different from the first polarization state.

11. The FeRAM cell of claim 7, wherein the top section and the middle section of the ferroelectric layer are adapted to be programmed to have a first polarization state and the bottom section of the ferroelectric layer is adapted to be programmed to have a second polarization state, wherein the second polarization state is different from the first polarization state.

12. The FeRAM cell of claim 7, wherein the top section, the middle section, and the bottom section of the ferroelectric layer have a difference in horizontal thickness of at least 0.5 nm.

* * * * *